United States Patent [19]
Nakagiri

[11] Patent Number: 5,555,479
[45] Date of Patent: Sep. 10, 1996

[54] REDUCTION PROJECTION LENS SYSTEM INCLUDING REFRACTIVE AND DIFFRACTIVE OPTICAL ELEMENTS

[75] Inventor: Kunie Nakagiri, Hachioji, Japan

[73] Assignee: Olympus Optical Co., Ltd., Tokyo, Japan

[21] Appl. No.: 332,121

[22] Filed: Oct. 31, 1994

[30] Foreign Application Priority Data

Oct. 29, 1993 [JP] Japan ................... 5-271675

[51] Int. Cl.$^6$ ............... G02B 3/08; G02B 3/02; G02B 5/18; G02B 13/18
[52] U.S. Cl. ............... 359/355; 359/565; 359/651
[58] Field of Search ............... 359/350, 355, 359/565, 566, 651

[56] References Cited

U.S. PATENT DOCUMENTS

| | | | |
|---|---|---|---|
| 4,200,352 | 4/1980 | Yuta | 359/355 |
| 4,770,477 | 9/1988 | Shafer | 359/355 |
| 4,891,663 | 1/1990 | Hirose | 359/355 |
| 5,052,763 | 10/1991 | Singh et al. | 359/355 |
| 5,153,772 | 10/1992 | Kathman et al. | 359/565 |
| 5,161,059 | 11/1992 | Swanson et al. | 359/355 |
| 5,170,207 | 12/1992 | Tezuka et al. | |
| 5,257,133 | 10/1993 | Chen | 359/565 |
| 5,287,218 | 2/1994 | Chen | 359/565 |
| 5,305,138 | 4/1994 | Freedenberg et al. | 359/355 |

FOREIGN PATENT DOCUMENTS

| | | |
|---|---|---|
| 60-140310 | 7/1985 | Japan . |
| 1315709 | 12/1989 | Japan . |
| 534593 | 2/1993 | Japan . |

*Primary Examiner*—Jon W. Henry
*Attorney, Agent, or Firm*—Cushman, Darby & Cushman

[57] ABSTRACT

The invention relates to a reduction projection lens system of high resolution which enables chromatic aberration to be corrected, and can be improved in terms of transmittance by making the total thickness of the vitreous material forming said lens system. This reduction projection lens system includes refractive and diffractive optical elements and uses as the light source a spectral light source having a center wavelength of up to 300 nm and a wavelength spectral bandwidth of ±0.5 pm to ±200 pm such as an ArF or KrF excimer laser. The refractive optical element includes at least one aspheric surface, and the refractive and diffractive optical elements are made of the same vitreous material, e.g., $SiO_2$. conditions, $0.02<|d/D|<0.17$ and $0.01<|h/H|<0.25$ are satisfied, wherein d is the distance from the pupil of the lens system to the diffractive optical element, D is the conjugate distance, h is the height of the off-axis principal ray farthest off the axis in the diffractive optical element, and H is the effective radius of the diffractive optical element.

8 Claims, 8 Drawing Sheets

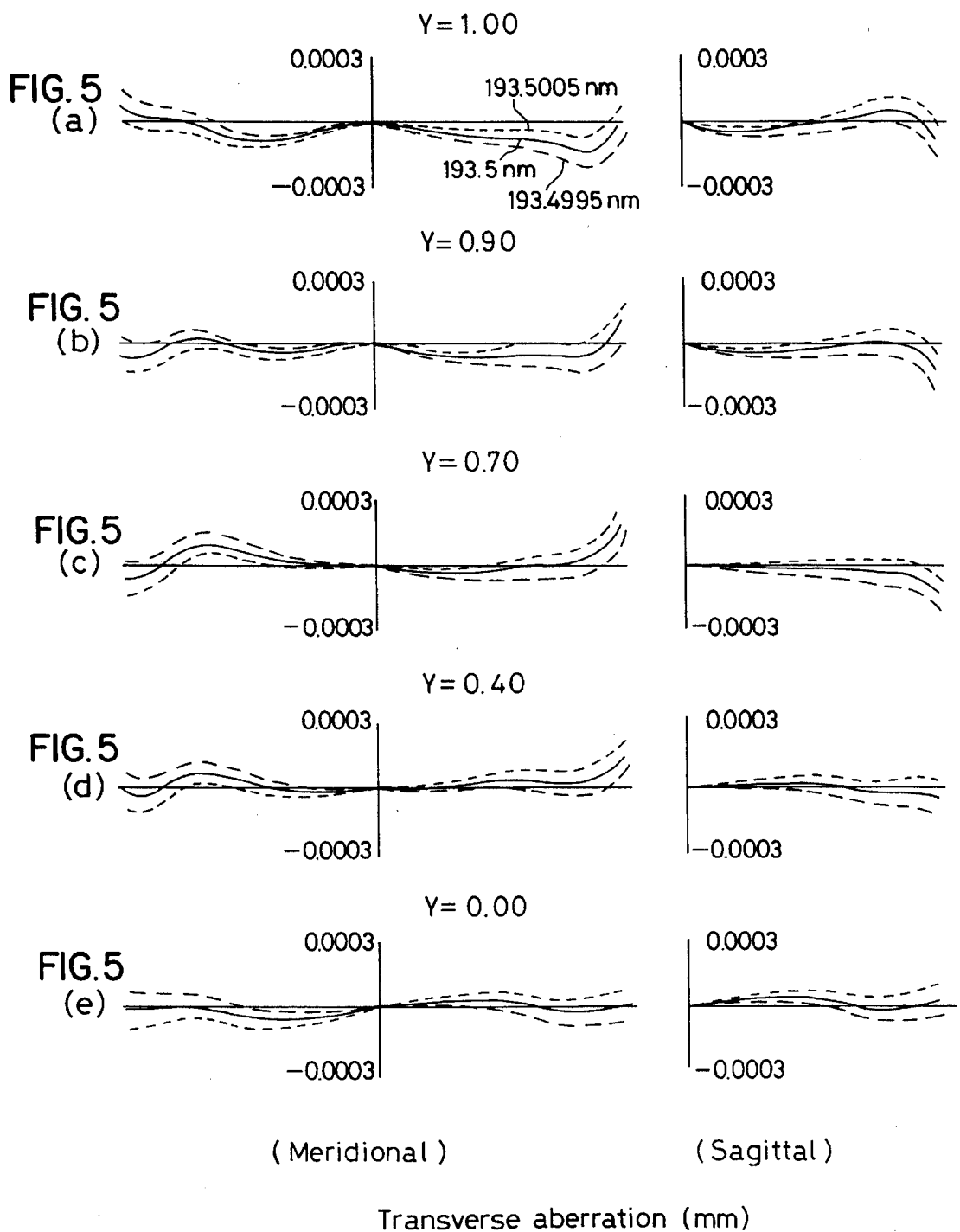

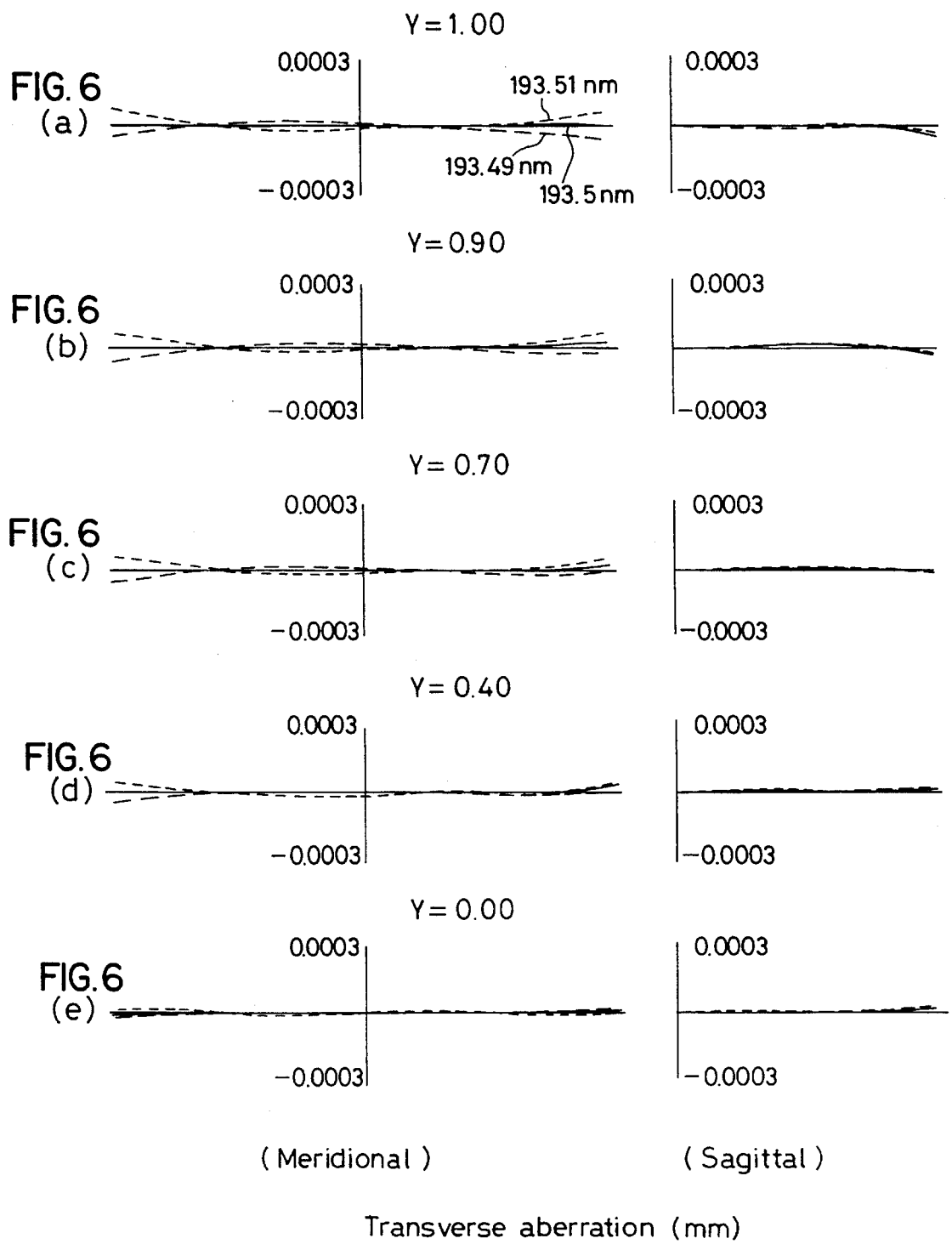

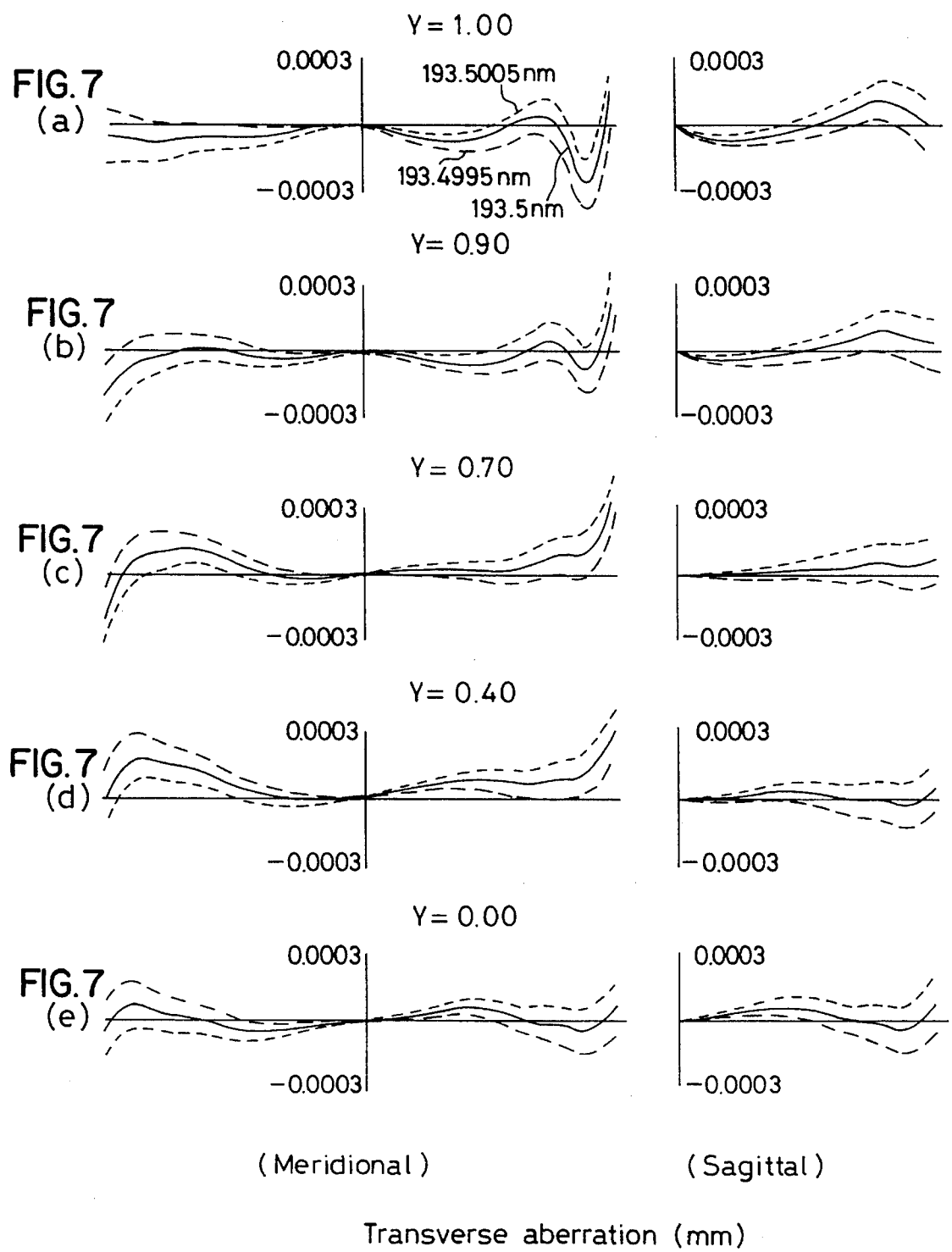

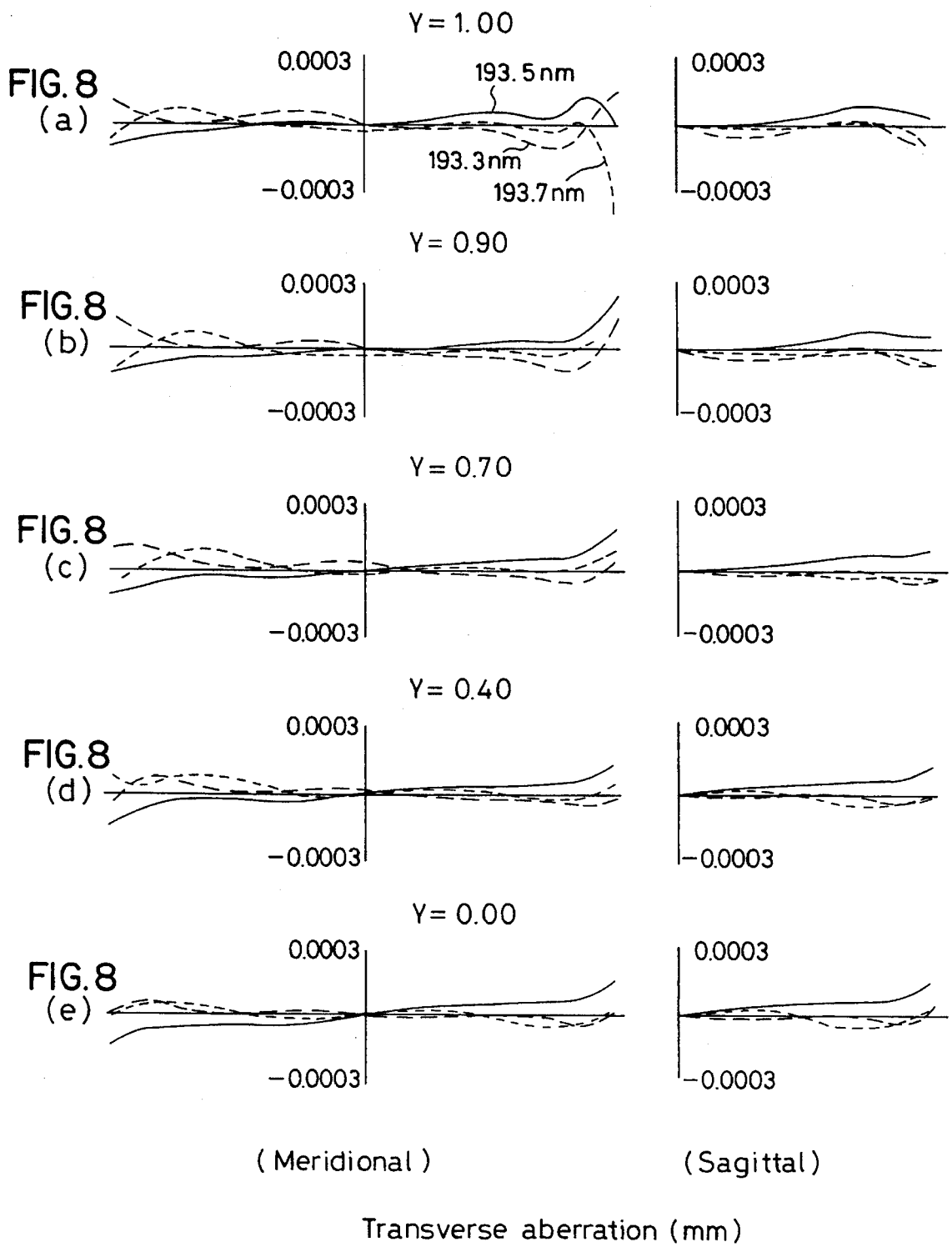

REDUCTION PROJECTION LENS SYSTEM INCLUDING REFRACTIVE AND DIFFRACTIVE OPTICAL ELEMENTS

BACKGROUND OF THE INVENTION

The present invention relates generally to a reduction projection lens system for use on equipment for the fabrication of integrated circuits such as ICs and LSIs, and more particularly to a reduction projection lens system for transferring a circuit pattern drawn on a mask onto a silicon wafer by the reduction projection aligning process.

Generally, the resolution of an image projected with a projection lens system is proportional to the numerical aperture and inversely proportional to the wavelength used. With recent remarkable progress in the degree of integration of integrated circuit, there is an increasing need for projection lens systems having some increased resolving power. Resolving power becomes better with an increase in numerical aperture. However, this makes the depth of focus so small that it is required to place focusing under very precise control. There is another problem that a silicon wafer onto which a circuit pattern is to be transferred is required to have very high-flatness, and which becomes unpractical. In recent years, it has thus been attempted to increase resolving power while the depth of focus is maintained by making the wavelength used short rather than by making the numerical aperture large. At present, light of 436 nm or 365 nm from mercury lamps has been used. Light sources of 300 nm or shorter wavelengths are also used. For instance, JP-A 60-140310 teaches the use of a KrF excimer laser that gives out an emission spectrum of 248 nm, and JP-A 1-315709 and 5-34593 refer to the use of ArF excimer lasers that give out an emission spectrum of 193 nm.

To correct for chromatic aberration of lens systems, the use of diffractive optical elements characterized by the inverse dispersion has been put forward, as set forth in JP-A 4 214516.

Essentially inevitable for a reduction projection lens system is to make substantially complete correction for both axial and off-axis aberrations, thereby assuring high resolution and a wide exposure region. However, there is an unavoidable increase in the number of lenses forming a projection lens system.

For instance, to correct for spherical aberration of a lens system consisting only of spherical lenses made of a single vitreous material, it is necessary to divide one lens into a plurality of lens elements which have the same power in total. To correct for field curvature, a number of lenses having positive and negative refracting powers must be arranged at proper locations, resulting in an extreme increase in the number of lenses forming the lens system.

The vitreous material usable at wavelengths of and shorter than 300 nm is practically limited to $SiO_2$ (quartz) or $CaF_2$ (fluorite) in view of transmittance. If other practical factors such as processability are taken into consideration, however, the usable vitreous material is restricted to $SiO_2$ (quartz) alone. For instance, consider a reduction projection lens system using a KrF excimer laser of 246 nm wavelength as a light source and only $SiO_2$ (quartz) as the vitreous material. As can be seen from JP-A 60-140310, there are increases in both the number of lenses and the total thickness of the vitreous material. Therefore, the use of a light source of shorter wavelengths, e.g., an ArF excimer laser of 193.5 nm gives rise to a transmittance decrease even with the use of $SiO_2$ (quartz). Thus, there have been some problems such as magnification and best focus variations of lenses due to exposure light and heat absorption, and low throughout due to underexposure.

To avoid this transmittance drop, it has been attempted to use aspheric surfaces for a projection lens system to reduce the total lens thickness, as set forth in JP-A 5-34593. In this case, however, it is impossible to correct for chromatic aberration of the lens system, because the lens system is built up of a single vitreous material. This has led to another problem that unless the bandwidth of the wavelength spectrum of the light source is extremely reduced, there is then a drop of the resolution of the projection lens system. For instance, the lens system disclosed in JP-A 5-34593 would malfunction and become practically useless, unless the bandwidth is reduced to ±0.5 pm (picometer) (FWHM) or lower. For KrF or ArF excimer lasers, however, it is generally recommendable to insert in the resonators a wavelength dispersion element such as an etalons or a grating, thereby reducing the spectral bandwidth. Indeed, it is still very difficult to achieve stable laser oscillation after the wavelength spectrum has been reduced to ±0.5 pm (FWHM).

Such a load on the light source may possibly be reduced by incorporating in the projection lens system several $CaF_2$ (fluorite) pieces as chromatic aberration correctors. However, $CaF_2$ (fluorite) is a material so soft that it is difficult to process, that is, it cannot be used as a practical lens material. To correct for chromatic aberration, JP-A 4-214516 discloses the use of a diffractive optical element characterized by the inverse dispersion, but it fails to provide a solution to the problems mentioned above due to an increase in the total lens thickness.

SUMMARY OF THE INVENTION

In view of the situations mentioned above, it is an object of the present invention to provide a reduction projection lens system of high resolution, which enables chromatic aberration to be well corrected and can make the total vitreous material thickness of the lens system so small that the transmittance can be improved.

To provide a solution to the problems mentioned above, the present invention provides a reduction projection lens system which uses a spectral light source having a center wavelength at up to 300 nm and includes a refractive optical element and a diffractive optical element, characterized in that the element includes at least one aspheric surface.

In the present invention, it is preferable to use an ArF or KrF excimer laser as the light source.

In the present invention, it is desired that the diffractive optical elements be all made up of the same vitreous material. It is also desired that the spectral bandwidth in wavelength of the light source used be in the range of ±0.5 pm to ±200 pm (FWHM).

In the present invention, it is desired that the following condition be satisfied:

$$0.02 < |d/D| < 0.17 \quad (3)$$

$$0.01 < |h/H| < 0.25 \quad (4)$$

Where d is the distance from the pupil of the lens system to the diffractive optical element, D is the conjugate distance, i.e. the distance between the object and the image, h is the height of the most off-axis principal ray in the diffractive optical element, and H is the effective radius of the diffractive optical element.

In the ensuing description, reference will be made to why such a lens arrangement as mentioned is used in the present invention and how it works.

With this lens arrangement, it is possible to increase the degree of freedom of lens design, because aspheric surfaces are incorporated in the refractive optical element, and so the latter, too, can behave as an aspheric surface. It is thus feasible to achieve a practical-enough lens system without causing any increase in the number of lenses but with the total lens thickness kept thin.

A diffractive optical element is inverse in wavelength dispersibility to an ordinary diffractive optical element, and has very high dispersive power. That is, even a lens arrangement which includes one diffractive optical element and is made of $SiO_2$ (quartz) alone as the vitreous material has a sufficient effect upon correcting for chromatic aberration. The diffractive optical element can also be effective for correcting for monochromatic aberrations, not only because it has an effect upon correcting for chromatic aberration, but also because it can easily be so shaped as to have an aspheric action. It is, however, to be noted that if the aspheric action surfaces to be located in an projection lens system are limited to the diffractive optical element alone, there is then a decrease in the degree of freedom of lens design, with the result that at least two aspheric diffractive optical elements are needed. However, when a plurality of diffractive optical elements are incorporated in a projection lens system, the efficiency of the light to be used is likely to drop, possibly with a decreased throughput due to underexposure, because the diffractive optical elements may have the same problem of efficiency. Another problem with a diffractive optical element is that, although depending upon where it is located, it may give rise to chromatic coma due to its considerable inverse dispersibility; that is, there is a possibility that some limitation is placed on where it is located in the lens system; that is, an aspheric diffractive optical element cannot be located at the place where the aspheric surface is needed. Thus, if a refractive optical element is allowed to have an aspheric surface, any decrease in the efficiency of the light to be used is avoided with an increase in the degree of freedom of where an aspheric surface is located, and this makes it possible to design a projection lens system having high resolution.

A detailed account will now be given of one preferable mode for carrying out the present invention.

According to the lens system of the present invention, it is easy to control the correction for the overall distortion and field ourvature thereof, because a refractive optical element of negative refracting power located in the near side to the object is allowed to include an aspheric surface.

In the lens unit located in the near side to the object, the off-axis principal rays pass through the peripheral region, and so the refracting action thereon is larger then that on the axial marginal rays passing in the vicinity of the optical axis. At the same time, the off-axis principal rays passing through the meridional and sagittal surfaces undergo appreciably different refracting actions. Thereby, in lens unit located at the position mentioned above, distortion and field curvature are likely to occur.

Therefore, if the number of lenses forming the lens unit at the position mentioned above is merely reduced to make the total thickness of the vitreous material thin, negative distortion becomes large, but there is not any surface for correcting for this aberration by giving positive distortion. In addition, positive field curvature becomes large, but there is again not any surface for correcting for this aberration by giving negative field curvature.

An aspheric surface is needed to be incorporated on a certain lens of the lens unit located at the position mentioned above to give positive distortion and negative curvature of field. This is an essential requirement for making satisfactory correction for the overall distortion and field curvature of the lens system.

To be more specific, an aspheric surface with the refracting power decreasing as distance from the optical axis increases is applied to a negative lens incorporated in the lens unit lying near the object to prevent a negative refractive action on the off-axis principal rays from becoming excessive, so much positive distortion is allowed to occur, thereby decreasing the amount of the negative distortion occurring in the lens unit located at the position mentioned above. In addition, the aspheric surface acts to produce much negative field curvature, thereby again decreasing the amount of positive field curvature occurring in the lens unit.

To correct distortion and field curvature, the present invention does not rely on combinations of many lenses having positive and negative powers in the lens unit in a projection lens system which tends to give rise to distortion and curvature of field. But, by applying at least one aspheric surface to the lens, the present invention makes it possible to reduce the number of lenses and correct both aberrations at the same time.

It is also preferable to incorporate an aspheric surface in a lens unit lying near the image, in which the off-axis principal rays pass through the margin to cause distortion and field curvature to be likely to occur, whereby the amounts of the two aberrations mentioned above are so reduced that the overall performance of the lens system can be improved.

It is still preferable to apply an aspheric surface to a diffractive optical element at positions where both axial and off-axis marginal rays are at considerable heights, whereby spherical aberration and coma can be corrected so that the general performance of the lens system can be improved.

To cancel out much negative spherical aberration that occurs in a spherical lens system, it is desired that one aspheric surface for correcting spherical aberration, with the positive refracting power decreasing as farther off the optical axis, be applied to a lens at a position where axial and off-axis marginal rays are at considerable heights. This makes it possible to achieve a projection lens system having a smaller thickness of viterous material in total. It is of course possible to correct for the spherical aberration by the aspheric action of a diffractive optical element, but it is then desired that the diffractive optical element be located in the vicinity of the pupil position of the lens system in such a way that the aspheric action of the diffractive optical element has no adverse influence on coma. In some cases, however, with this position of the diffractive optical element, it is difficult to completely, correct for chromatic aberration of magnification by the inverse dispersion action of the diffractive optical element. It is desired, therefore, to apply an aspheric surface for correcting for the spherical aberration to a refractive optical element located in the vicinity of the pupil position of the lens system.

It is even still preferred that an aspheric diffractive optical element be located slightly away from the pupil of the lens system, and another aspheric refractive element be located in addition to the above-mentioned aspheric refractive optical element for correcting spherical aberration to reduce coma that cannot completely be corrected even by use of the aspheric effect of the aspheric diffractive optical element as well as coma of higher order, thereby further improving the overall performance of the lens system.

A detailed account will then be given of the diffractive optical elements. Generally required for correcting for chromatic aberration of a lens system is to satisfy the following thin-lens approximate equation:

$$\Sigma h_i^2/f_i v_i = 0 \tag{1}$$

where $h_i$ is the height of the marginal ray in each lens, $f_i$ is the focal length of each lens, and $v_i$ is the Abbe's number of each lens.

For a lens system made of a single vitreous material and designed to form a real image, however, Eq. (1) has inevitably a positive value; the chromatic aberration cannot completely be corrected. Here, consider the case of a diffractive optical element having a suitable positive value for the focal length $f_o$, a height of the marginal ray $h_o$ and the Abbe's number $v_o$. Since the Abbe's number has a negative value, the term attributable to the diffractive optical element cancels out the term attributable to the lens of the refractive lenses, so that the achromatic condition can be satisfied, as expressed by the following equation (2):

$$\Sigma h_i^2/f_i v_i + \Sigma h_o^2/f_o v_o = 0 \tag{2}$$

Eq. (2), mentioned just above, reveals that the diffractive optical element has great ability to correct for chromatic aberration in a lens system.

In the lens systems according to the present invention, a diffractive optical element having an inverse dispersion effect is located in the vicinity of the pupil thereof. It is here to be noted that the pupil position is defined *as the position where the most off-axis principal rays traverse the optical axis*. In the present invention, a wide exposure area is needed, and each aberration must be well corrected nearly to the diffraction limited. To this end, off-axis chromatic coma, chromatic aberration of magnification and other aberrations must be well corrected as well as axial chromatic aberration.

In the present invention, therefore, it is not always possible to have chromatic correction effect for chromatic aberration of magnification if the diffractive optical element aligns with the pupil position of the lens system. It follows that it is important that the diffractive optical element be slightly displaced from the pupil position of the lens system so as to correct for chromatic aberration of magnification and chromatic coma while correcting for longitudinal chromatic aberration. However, as the diffractive optical element is spaced too far away from the pupil position of the lens system, as illustrated in JP A 2-410271, the corrections for chromatic coma, chromatic aberration of magnification and longitudinal chromatic aberration are ill balanced, so that no enough correction for the chromatic aberration can be made with a spectral bandwidth of a light source.

To keep longitudinal chromatic aberration, chromatic aberration of magnification and chromatic aberration in a well-balanced state, it is necessary to satisfy both the following conditional formulae:

$$0.02 < |d/D| < 0.17 \tag{3}$$

$$0.01 < |h/H| < 0.25 \tag{4}$$

where d is the distance from the pupil of the lens system to the diffractive optical element, D is the conjugate distance, i.e., the distance between the object and the image, h is the height of the principal ray passing farthest off the axis in the diffractive optical element, and H is the effective radius of the diffractive optical element.

when the upper limits of Eqs. (3) and (4) are exceeded, even though chromatic aberration of magnification and longitudinal chromatic aberration will be fully corrected, but it will be impossible to correct for chromatic coma. When the lower limits of Eqs. (3) and (4) are not reached, on the other hand, chromatic coma and longitudinal chromatic aberration will be satisfactorily corrected, but it will be impossible to correct for chromatic aberration of magnification. In a projection lens system that is made of a single vitreous material as described in the present invention, it is impossible to correct chromatic coma and chromatic aberration of magnification with other lenses of different materials; of great importance is that the diffractive optical element be located in the lens system while Eqs. (3) and (4) are well satisfied.

Still other objects and advantages of the present invention will in part be obvious and will in part be apparent from the specification.

The present invention accordingly comprises the features of construction, combination of elements, and arrangement of parts which will be exemplified in the construction hereinafter set forth, and the scope of the present invention will be indicated in the claims.

BRIEF DESCRIPTION OF THE DRAWINGS

FIGS. 5(a)–5(c) are diagrams showing transverse aberrations of Example 1, FIGS. 6(a)–6(e) are diagrams showing transverse aberrations of Example 2, FIGS. 7(a)–7(e) are diagrams showing transverse aberrations of Example 3, and FIGS. 8(a)–8(e) are diagrams showing transverse aberrations of Example 4.

DESCRIPTION OF THE PREFERRED EMBODIMENTS

In the following description, reference will be made to Example 1 to 4 of the reduction projection systems according to the present invention.

Figure 1:
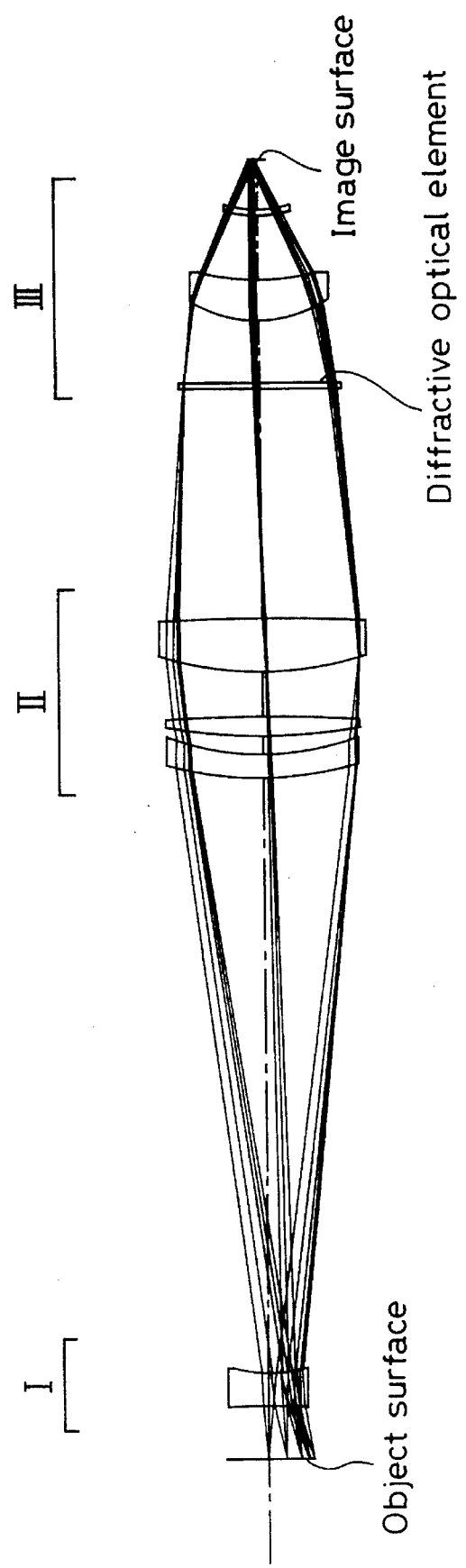
FIG. 1 is a sectional view showing the lens arrangement of Example 1 of the reduction projection lens system according to the present invention.
Figure 2:
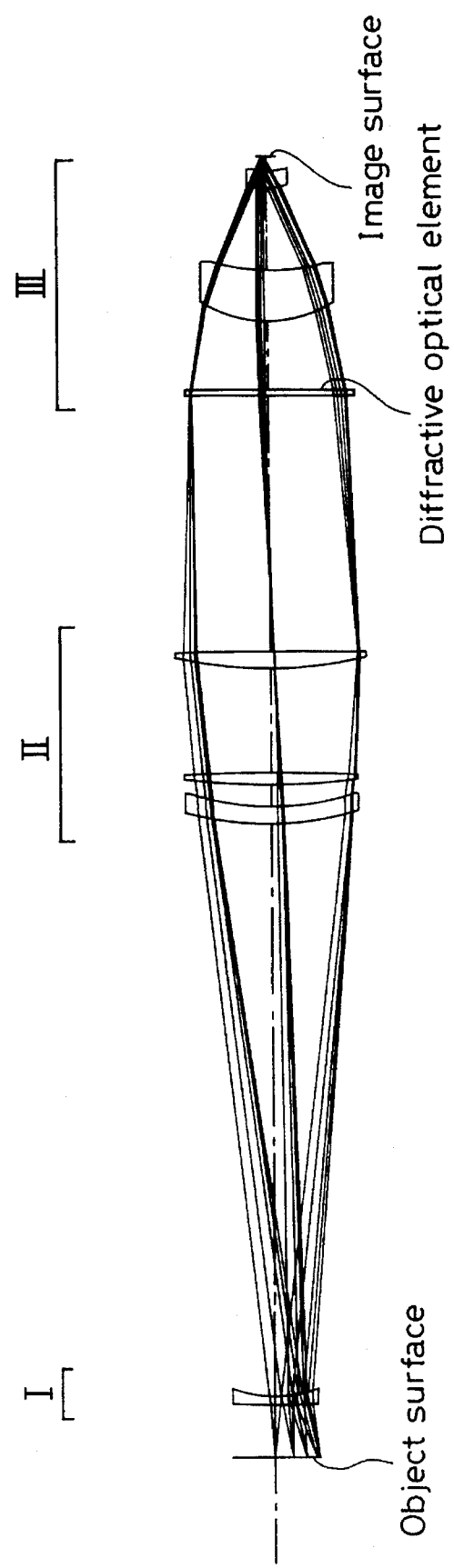
FIG. 2 is a sectional view showing the lens arrangement of Example 2 of the reduction projection lens system according to the present invention.
Figure 3:
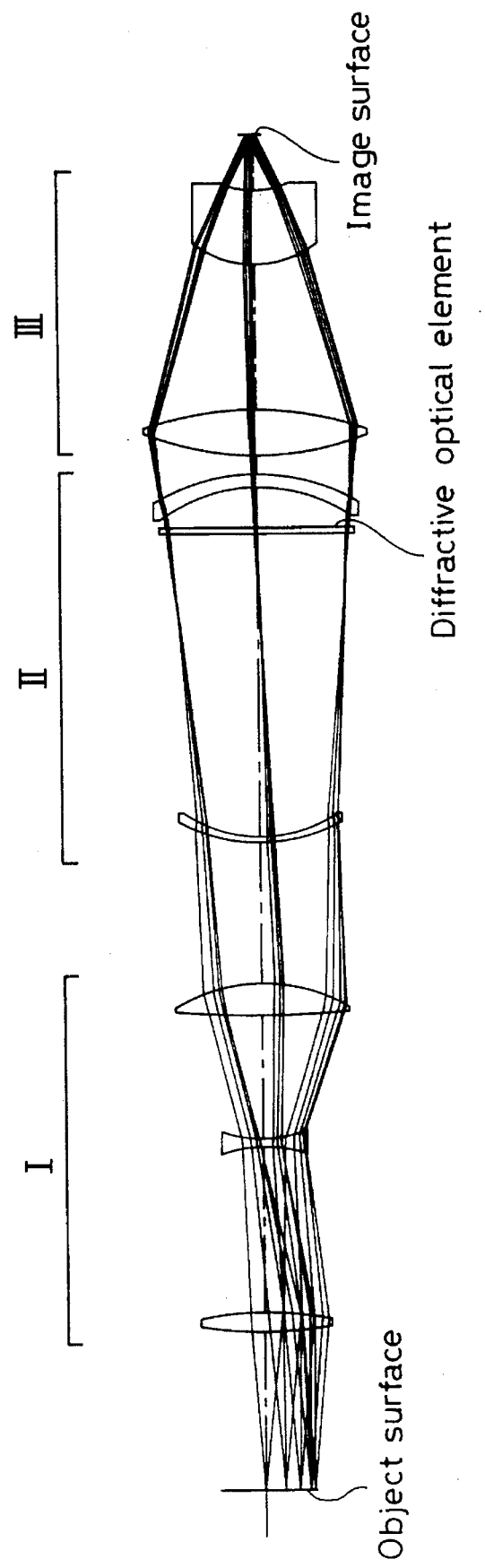
FIG. 3 is a sectional view showing the lens arrangement of Example 3 of the reduction projection lens system according to the present invention.
Figure 4:
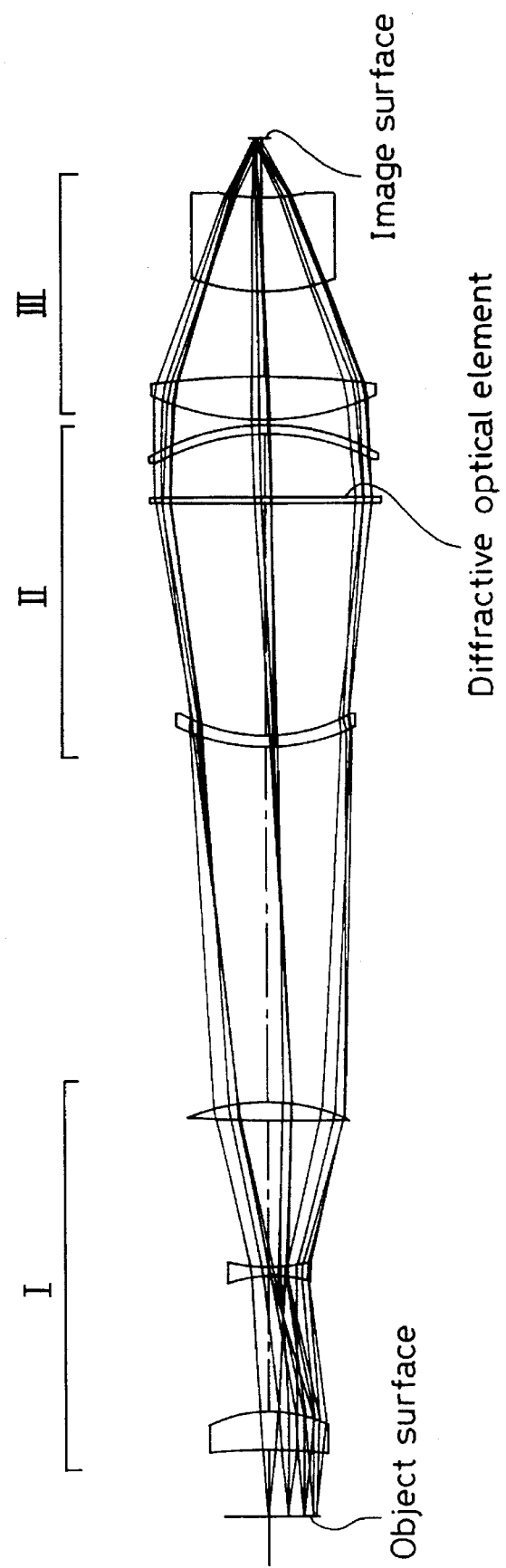
FIG. 4 is a sectional view showing the lens arrangement of Example 4 of the reduction projection lens system according to the present invention.

FIGS. 1 to 4 are sectional views of the lens arrangements of Examples 1 to 4, lens data about which will be set out later, and FIGS. 5(a) to 8(e) are diagrams of transverse aberrations at the respective image heights. In the aberration diagrams, Y stands for the relative image height.

In Ex. 1 or 2, the first lens unit I consists of one double-concave negative lens, the second lens unit II consists of one negative meniscus lens and two double-convex positive lenses, and the third lens unit III consists of one diffractive optical element having positive power and a negative Abbe's number and two positive meniscus lenses. Referring then to Examples 3 and 4, the first lens unit I consists of one double-concave negative lens and two double-convex positive lenses between which the negative lens is located for Example 3 and one positive meniscus lens, one double-concave negative lens and one double-convex positive lens for Example 4, the second lens unit II consists of one diffractive optical element having positive power and a negative Abbe's number and two negative meniscus lenses with the opposing concave surfaces between which the diffractive optical element is located, and the third lens unit III consists of one double-convex positive lens and one positive meniscus lens.

Referring here to aspheric surfaces in Example 1 or 2, one is used for each of the final surfaces of the first and second units I and II and two for the diffractive optical element and the object-side surface of the positive meniscus lens on the image side for the third unit III; four in all. In Example 3 or 4, three are used for the object-side surfaces of the three lenses of the unit I, two for the image-side surface of the lens on the object side and the diffractive optical element of the unit II, and two for the foremost and final surfaces of the unit III; seven in all.

In the present invention, it is required to correct axial aberrations and make almost complete corrections for distortion, curvature of field, coma and other off-axis aberrations, and to make good corrections for not only longitudinal chromatic aberration but chromatic aberration of magnification and chromatic coma as well, as already noted. In what follows, a detailed account will be given of how the above off-axis aberrations are corrected in the present invention with reference to Examples 1 to 4.

An account will first be given of Examples 1 and 2. For a diffractive optical element, it is well known that the smaller the pitch, the stronger the power and the more enhanced the achromatic effect. In view of some problems involved in its fabrication, however, it is desired that the pitch be at least 1 μm. In these examples, the minimum pitch of the diffractive optical element is limited to at least 1 μm. In Example 1 the achromatizable wavelength half-width of the lens system is 0.5 pm with the diffractive optical element having a minimum pitch of 2 μm, and in Example 2 the achromatizable wavelength half-width of the lens system is 10 pm with the diffractive optical element having a minimum pitch of 1 μm.

In Example 1 or 2, the double-convex negative lens located in the first unit I has so strong a power that the off-axis principal rays passing through the margin undergo a much stronger refracting action as compared with the paraxial rays, yielding much more distortion and curvature of field. However, this is avoided by use of an aspheric surface with the refracting power decreasing farther and farther off the optical axis, whereby the amounts of the above various aberrations produced are controlled, thus making it easy to place the amounts of these aberrations to occur in the overall lens system under control.

Better corrections for distortion and curvature of field are achievable by applying an aspheric surface to the final lens of the third unit III which is proximate to the image side and in which the off-axis principal rays pass through the position farthest off the optical axis.

Better corrections for coma and spherical aberration are again achievable by applying aspheric surfaces to the sixth (final) surface of the second unit II and the diffractive optical element of the third unit III.

Correction for chromatic aberration is achievable by locating the diffractive optical element in the lens system in such a way that Eqs. (3) and (4) are satisfied.

Reference will then be made to Examples 3 and 4. These examples are nearly similar to Examples 1 and 2, except that the lens systems of Examples 1 and 2 are telecentric at the exit sides, whereas those of Examples 3 and 4 are telecentric on both their sides. In Example 3 the achromatizable wavelength half-width of the lens system is 0.5 pm with the diffractive optical element having a minimum pitch of 4 μm, and in Example 4 the achromatizable wavelength half-width of the lens system is 200 pm with the diffractive optical element having a minimum pitch of 1 μm.

In Examples 3 and 4 corrections for distortion and curvature of field are made with the first lens unit I, as in Examples 1 and 2. These examples are more preferable to Examples 1 and 2 in that in the first unit I the double-concave negative lens is interposed between the two positive lenses so that the incident sides are made telecentric. The reason is that the power distribution for, and arrangement of, the lenses forming the first unit I are placed under so free control that the distortion and curvature of field introduced by the double-concave negative lens can be canceled out by the two positive lenses without changing the composite focal length of the first unit I. Thus, Examples 3 and 4 are different from Examples 1 and 2 in that the distortion and curvature of field produced by the double-concave negative lens are not only reduced, but these aberrations are made to vanish almost completely, so that other off-axis aberrations can be corrected with the second and third units II and III.

It is more preferable to apply aspheric surfaces to the two positive lenses of the first unit I, thereby placing the amounts of the distortion and curvature of field introduced by these lenses under fine control and so making it possible to set off the amounts of the aberrations introduced by the double-concave negative lens.

As is the case with Examples 1 and 2, better corrections for distortion and curvature of field are achievable by applying an aspheric surface to the final lens of the third unit III which is proximate to the image side and in which the off-axis principal rays pass through the position farthest off the optical axis.

As is again the case with Examples 1 and 2, better corrections for coma and spherical aberration are achievable by applying aspheric surfaces to the lenses forming the second and third units II and III. In Examples 3 and 4 aspheric surfaces are used for the second surface of the second unit II and the diffractive optical element as well as for the first surface of the third unit III.

As is still again the case with Examples 1 and 2, correction for chromatic aberration is achievable by locating the diffractive optical element in the lens system in such a way that Eqs. (3) and (4) are satisfied.

Examples 3 and 4 are still more preferable to Examples 1 and 2 in that, to allow the chromatic coma occurring in the diffractive optical element to vanish, a lens having strong positive power is located in the third unit III to make the achromatizable wavelength half-width of the light source wider than that in Example 2. Since the refractive optical elements all but the diffractive optical element are made of the same vitreous material, light coming from one object point farthest off the axis and having a certain wavelength width around 193.5 nm is dispersed by the refractive optical elements when it is incident on the diffractive optical element through the refractive optical elements; in other words, it does not appear to come from one object point. This causes the off-axis principal rays of various colors to be incident on the diffractive optical element at varying heights from the optical axis, yielding different comas for each color. This is chromatic coma introduced by the diffractive optical element. The amount of the chromatic coma introduced may be reduced, if the diffractive optical element is located in the lens system in conformity with Eqs. (3) and (4). However, as the wavelength half-width of the light source becomes wide, there is an increase in the amount of the chromatic coma introduced, resulting in a drop of the resolution of the lens system. If, when the wavelength half-width of the light source is made wide, chromatic coma with the sign opposite to that of the chromatic coma introduced by the diffractive optical element is allowed to occur by any one of the refractive optical elements, the general amount of the chromatic coma introduced can then be reduced. This cannot successfully be achieved without Example 4.

To reduce the amount of the chromatic coma introduced and achieve a lens system showing high resolution even with respect to a wide wavelength half-width of a light source, it is preferable to locate in the lens system a refractive optical element that conforms to not only Eqs. (3) and (4) but the following conditions as well:

$$0.001 < |f_{def}/f_{ref}|/D < 0.008 \quad (5)$$

$$0.01 < |h_{def} - h_{ref}|/H' < 0.1 \quad (6)$$

where $f_{def}$ is the focal length of the diffractive optical element, $f_{ref}$ is the focal length of the refractive lens provided to cancel out chromatic coma, $h_{def}$ is the height from the optical axis, at which the principal ray is incident on the diffractive optical element, $h_{ref}$ is the height from the optical axis, at which the most off-axial principal ray is incident on the lens provided to correct chromatic coma, and H' is the maximum value of the effective radii of the lens system.

In Examples 3 and 4 it is to be noted that the refractive optical element used to allow this chromatic coma to vanish is the double-convex positive lens on the object side of the third unit III.

Set out below are lens data about Examples 1–4, wherein $r_1, r_2 \ldots$ are the radii of curvature of the lenses, $d_1, d_2 \ldots$ the spacing between the lenses, $n_1, n_2 \ldots$ the refractive indices at 193.5 nm of the lenses, $v_1, v_2 \ldots$ the Abbe's numbers of the lenses, WDO the working distance on the object side, WD the working distance on the image side, f the focal length of the lens system, ENP the entrance pupil position (as measured from the object surface), d/D the value of Cond. (3), h/II the value of Cond. (4), $|f_{def}/f_{ref}|/D$ the value of Cond. (5), and $|h_{def} - h_{ref}|/H'$ the value of Cond. (6).

When letting x and y stand for the optical axis direction and the direction perpendicular thereto, respectively, aspheric surface shape is given by $$x = (y^2/r)/[1 + \{1 - (y^2/r^2)\}1/2] |a_4 y^4| a_6 y^6 + 2_8 y^8 + a_{10} y^{10}$$

where r is the paraxial radius of curvature, and $a_4, a_6, a_8$ and $a_{10}$ are spherical coefficients.

In each example a wavelength of 193.5 nm is used at a magnification of ⅕ and a numerical aperture NA of 0.45. The conjugate distance OI (=D) is 1,250 mm in Examples 1 and 2 and 1,000 nm in Examples 3 and 4, while the exposure zone is 12.5 mm×12.5 mm in Examples 1 and 2 and 10 mm×10 mm in Examples 3 and 4. In each example the vitreous material of the lens system is overall made of fused quartz $SiO_2$ and the diffractive optical element is designed by the ultra-high-index method with a diffraction surface on the back side of a fused quartz plate of 3 mm in thickness.

Here a brief account is given of the ultra-high-index method. A diffractive optical element forming a Fresnel zone plate may be replaced by a refractive optical system made of an optical material having a very high index of refraction. This will briefly be explained with reference to an article by W. C. Sweatt (*J. Opt. Soc. Am.*, Vol. 69, No. 3, March 1979).

Here let $\theta$ and $\theta'$ denote the angles of incidence and exit of a beam of light. Then, the diffraction equation for a diffraction grating also holds for the refraction of the light beam through the diffractive optical element. That is, $$\sin \theta - \sin \theta' = m\lambda/d \quad (i)$$

where m is the order of diffraction, $\lambda$ is the wavelength of the light beam, and d is the Fresnel pitch.

Next, let n, z and h stand for the index of refraction of the refractive optical system, the thickness of a portion through the light beam passes, and the distance from the optical axis, respectively. If $n \to \infty$ and $z \to 0$, Eq. (ii) can be deduced from Snell's equation.

$$\sin \theta - \sin \theta' = (n-1) dz/dh \quad (ii)$$

From a comparison of these two equations, it is found that when the refractive index n is fully high.

$$m\lambda/d = (n-1) dz/dh \quad (iii)$$

By use of Eq. (3) it is possible to replace the diffractive optical element by the refractive optical system.

Here, since $$K = m/[d(dz/dh)],$$

$$(n-1) = K\lambda \quad (iv)$$

Since Eq. (4) must also be true of wavelengths other than the reference wavelength $\lambda_c$; it can be written as follows:

$$n(\lambda) = 1 + K\lambda \quad (v)$$

The Abbe's number $v_4$ of the diffractive optical element can be found from Eq. (5), as follows:

$$\begin{aligned}
v_d &= (n_d - 1)/(n_F - n_c) \\
&= [(1 + K\lambda_d) - 1]/[(1 + k\lambda_F) - (1 + k\lambda_c)] \\
&= k\lambda_d/[K(\lambda_F - \lambda_c)] \\
&= \lambda_d/(\lambda_F - \lambda_c) = -3.45
\end{aligned}$$

In each example it is to be noted that for replacement of the diffractive optical element the index of refraction of a virtual vitreous material at a center wavelength of 193.5 nm is assumed to be 1001.

EXAMPLE 1

| | | | |
|---|---|---|---|
| $r_1 = -759.090$ | $d_1 = 31.284$ | $n_1 = 1.56$ | $v_1 = 67.8$ |
| $r_2 = 90.644$ (Aspheric) | $d_2 = 573.416$ | | |
| $r_3 = 334.912$ | $d_3 = 22.128$ | $n_2 = 1.56$ | $v_2 = 67.8$ |
| $r_4 = 250.731$ | $d_4 = 18.776$ | | |
| $r_5 = 590.724$ | $d_5 = 16.643$ | $n_3 = 1.56$ | $v_3 = 67.8$ |
| $r_6 = -5403.674$ | $d_6 = 46.977$ | | |
| $r_7 = 861.819$ | $d_7 = 48.137$ | $n_4 = 1.56$ | $v_4 = 67.8$ |

-continued

| | | | |
|---|---|---|---|
| $r_8 = -2260.114$ (Aspheric) | $d_8 = 220.987$ | | |
| $r_9 = \infty$ | $d_9 = 3.000$ | $n_5 = 1.56$ | $v_5 = 67.8$ |
| $r_{10} = \infty$ | $d_{10} = 0.000$ | | |
| $r_{11} = 762797.553$ (Aspheric) (Diffractive Optical Element) | $d_{11} = 0.000$ | $n_6 = 1001$ | $v_6 = 3.45$ |
| $r_{12} = \infty$ | $d_{12} = 60.142$ | | |
| $r_{13} = 106.122$ | $d_{13} = 43.321$ | $n_7 = 1.56$ | $v_7 = 67.8$ |
| $r_{14} = 294.334$ | $d_{14} = 59.784$ | | |
| $r_{15} = 90.518$ (Aspheric) | $d_{15} = 6.440$ | $n_8 = 1.56$ | $v_8 = 67.8$ |
| $r_{16} = 114.588$ | | | |

Aspherical Coefficients
2nd surface $a_4 = -0.28630 \times 10^{-6}$
$a_6 = -0.47732 \times 10^{-11}$
$a_8 = -0.12345 \times 10^{-15}$
$a_{10} = -0.46956 \times 10^{-18}$
8th surface $a_4 = 0.85086 \times 10^{-8}$
$a_6 = -0.62746 \times 10^{-18}$
$a_8 = 0.97491 \times 10^{-10}$
$a_{10} = 0.19886 \times 10^{-22}$
11th surface $a_4 = -0.16096 \times 10^{-11}$
$a_6 = -0.77723 \times 10^{-17}$
$a_8 = 0.44694 \times 10^{-21}$
$a_{10} = -0.28782 \times 10^{-20}$
15th surface $a_4 = -0.22447 = 10^{-4}$
$a_6 = -0.67562 \times 10^{-10}$
$a_8 = 0.13527 \times 10^{-13}$
$a_{10} = -0.15838 \times 10^{-17}$
WDO = 50,000
WD = 48.967
f = 38.090
ENP = 192.513
d/D = 0.113
h/H = 0.088

EXAMPLE 2

| | | | |
|---|---|---|---|
| $r_1 = -2848.267$ | $d_1 = 8.308$ | $n_1 = 1.56$ | $v_1 = 67.9$ |
| $r_2 = 100.602$ (Aspheric) | $d_2 = 552.788$ | | |
| $r_3 = 332.456$ | $d_3 = 13.529$ | $n_2 = 1.56$ | $v_2 = 67.8$ |
| $r_4 = 251.110$ | $d_4 = 18.980$ | | |
| $r_5 = 585.120$ | $d_5 = 11.355$ | $n_3 = 1.56$ | $v_3 = 67.8$ |
| $r_6 = -5011.765$ | $d_6 = 103.808$ | | |
| $r_7 = 420.524$ | $d_7 = 14.548$ | $n_4 = 1.56$ | $v_4 = 67.8$ |
| $r_8 = -9391.364$ (Aspheric) | $d_8 = 247.979$ | | |
| $r_9 = \infty$ | $d_9 = 3.000$ | $n_5 = 1.56$ | $v_5 = 67.8$ |
| $r_{10} = \infty$ | $d_{10} = 0.000$ | | |
| $r_{11} = 435960.237$ (Aspheric) (Diffractive Optical Element) | $d_{11} = 0.000$ | $n_6 = 1001$ | $v_6 = -3.45$ |
| $r_{12} = \infty$ | $d_{12} = 68.860$ | | |
| $r_{13} = 110.331$ | $d_{13} = 51.696$ | $n_7 = 1.56$ | $v_7 = 67.8$ |
| $r_{14} = 284.071$ | $d_{14} = 77.589$ | | |
| $r_{15} = 109.141$ (Aspheric) | $d_{15} = 17.564$ | $n_8 = 1.56$ | $v_8 = 67.8$ |
| $r_{16} = 127.709$ | | | |

Aspherical Coefficients
2nd surface $a_4 = -0.24414 \times 10^{-6}$
$a_6 = 0.13222 \times 10^{-11}$
$a_9 = 0.80223 \times 10^{-15}$
$a_{10} = -0.19471 \times 10^{-19}$
8th surface $a_4 = 0.35548 \times 10^{-8}$
$a_6 = -0.53285 \times 10^{-18}$
$a_8 = -0.44123 \times 10^{-18}$
$a_{10} = -0.10159 \times 10{-22}$ -continued 11th surface $a_4 = -0.24666 \times 10^{-11}$
$a_6 = -0.11767 \times 10^{-18}$
$a_8 = -0.34772 \times 10^{-21}$
$a_{10} = -0.11103 \times 10^{-25}$
15th surface $a_4 = -0.41961 \times 10^{-6}$
$a_6 = -0.18985 \times 10^{-9}$
$a_8 = -0.45634 \times 10^{-13}$
$a_{10} = 0.49921 \times 10^{-17}$
WDO = 50.000
WD = 10.000
f = 40.172
ENP = 205.193
d/D = 0.142
h/H = 0.115

EXAMPLE 3

| | | | |
|---|---|---|---|
| $r_1 = 252.531$ (Aspheric) | $d_1 = 18.959$ | $n_1 = 1.56$ | $v_1 = 67.8$ |
| $r_2 = -287.917$ | $d_2 = 122.828$ | | |
| $r_3 = -76.336$ (Aspheric) | $d_3 = 5.000$ | $n_2 = 1.56$ | $v_2 = 67.8$ |
| $r_4 = 83.791$ | $d_4 = 90.783$ | | |
| $r_5 = 688.212$ (Aspheric) | $d_5 = 23.544$ | $n_3 = 1.56$ | $v_3 = 67.8$ |
| $r_6 = -127.932$ | $d_6 = 102.939$ | | |
| $r_7 = 111.110$ | $d_7 = 5.011$ | $n_4 = 1.56$ | $v_4 = 67.8$ |
| $r_8 = 95.981$ (Aspheric) | $d_8 = 225.849$ | | |
| $r_9 = \infty$ | $d_9 = 3.000$ | $n_5 = 1.56$ | $v_5 = 67.8$ |
| $r_{10} = \infty$ | $d_{10} = 0.000$ | | |
| $r_{11} = 1432200.000$ (Aspheric) | $d_{11} = 0.000$ | $n_6 = 1001$ | $v_6 = -3.45$ |
| (Diffractive Optical Element) | | | |
| $r_{12} = \infty$ | $d_{12} = 30.346$ | | |
| $r_{13} = -130.544$ | $d_{13} = 9.044$ | $n_7 = 1.56$ | $v_7 = 67.8$ |
| $r_{14} = -154.420$ | $d_{14} = 12.972$ | | |
| $r_{15} = 203.863$ (Aspheric) | $d_{15} = 32.427$ | $n_8 = 1.56$ | $v_8 = 67.8$ |
| $r_{16} = -278.866$ | $d_{16} = 110.103$ | | |
| $r_{17} = 66.125$ | $d_{17} = 55.723$ | $n_9 = 1.56$ | $v_9 = 67.8$ |
| $r_{18} = 75.715$ (Aspheric) | | | |

Aspherical Coefficients
1st surface $a_4 = 0.10995 \times 10^{-7}$
$a_6 = -0.87952 \times 10^{-12}$
$a_8 = -0.61759 \times 10^{-16}$
$a_{10} = -0.29317 \times 10^{-20}$
3rd surface $a_4 = 0.38712 \times 10^{-9}$
$a_6 = 0.32897 \times 10^{-10}$
$a_8 = 0.77965 \times 10^{-14}$
$a_{10} = 0.24614 \times 10^{-17}$
5th surface $a_4 = 0.38411 \times 10^{-8}$
$a_6 = -0.54083 \times 10^{-12}$
$a_8 = 0.20590 \times 10^{-16}$
$a_{10} = -0.20963 \times 10^{-20}$
8th surface $a_4 = 0.23628 \times 10^{-7}$
$a_6 = -0.30556 \times 10^{-12}$
$a_8 = -0.15890 \times 10^{-18}$
$a_{10} = -0.68784 \times 10^{-20}$
11th surface $a_4 = 0.18669 \times 10^{-12}$
$a_6 = 0.71468 \times 10^{-17}$
$a_8 = 0.10930 \times 10^{-20}$
$a_{10} = 0.29630 \times 10^{-24}$
15th surface $a_4 = -0.22026 \times 10^{-7}$
$a_6 = -0.63499 \times 10^{-12}$
$a_8 = -0.11270 \times 10^{-15}$ -continued $a_{10} = 0.32465 \times 10^{-21}$
18th surface $a_4 = 0.87882 \times 10^{-6}$
$a_6 = 0.16543 \times 10^{-9}$
$a_8 = 0.85945 \times 10^{-13}$
$a_{10} = -0.29573 \times 10^{-16}$
WDO = 117.371
WD = 39.100
$f = \infty$
ENP = $\infty$
d/D = 0.050
h/H = 0.085
$|f_{dcf}/f_{rcc}|/D = 0.0017$
$|h_{dcf} - h_{ref}|/H' = 0.0270$

EXAMPLE 4

| | | | |
|---|---|---|---|
| $r_1 = -451.787$ (Aspheric) | $d_1 = 29.268$ | $n_1 = 1.56$ | $v_1 = 67.8$ |
| $r_2 = -95.373$ | $d_2 = 98.552$ | | |
| $r_3 = -72.874$ (Aspheric) | $d_3 = 5.000$ | $n_2 = 1.56$ | $v_2 = 67.8$ |
| $r_4 = 96.857$ | $d_4 = 105.916$ | | |
| $r_5 = 872.263$ (Aspheric) | $d_5 = 13.387$ | $n_3 = 1.56$ | $v_3 = 67.8$ |
| $r_6 = -153.964$ | $d_6 = 258.764$ | | |
| $r_7 = -140.484$ | $d_7 = 5.000$ | $n_4 = 1.56$ | $v_4 = 67.8$ |
| $r_8 = 120.230$ (Aspheric) | $d_8 = 171.249$ | | |
| $r_9 = \infty$ | $d_9 = 3.000$ | $n_5 = 1.56$ | $v_5 = 67.8$ |
| $r_{10} = \infty$ | $d_{10} = 0.000$ | | |
| $r_{11} = 431766.784$ (Aspheric) | $D_{12} = 0.000$ | $n_6 = 1001$ | $v_6 = -3.45$ |
| (Diffractive Optical Element) | | | |
| $r_{12} = \infty$ | $d_{12} = 47.410$ | | |
| $r_{13} = -174.510$ | $d_{13} = 5.000$ | $n_7 = 1.56$ | $v_7 = 67.8$ |
| $r_{14} = -172.623$ | $d_{14} = 2.448$ | | |
| $r_{15} = 168.097$ (Aspheric) | $d_{15} = 32.344$ | $n_8 = 1.56$ | $v_8 = 67.8$ |
| $r_{16} = -858.048$ | $d_{16} = 62.950$ | | |
| $r_{17} = 136.937$ | $d_{17} = 70.000$ | $n_9 = 1.56$ | $v_9 = 67.8$ |
| $r_{18} = 197.925$ (Aspheric) | | | |

Aspherical Coefficients
1st surface $a_4 = 0.35676 \times 10^{-7}$
$a_6 = -0.48365 \times 10^{-11}$
$a_8 = 0.11268 \times 10^{-14}$
$a_{10} = -0.39366 \times 10^{-19}$
3rd surface $a_4 = 0.61584 \times 10^{-8}$
$a_6 = 0.82779 \times 10^{-10}$
$a_8 = -0.58285 \times 10^{-14}$
$a_{10} = 0.19177 \times 10^{-17}$
5th surface $a_4 = -0.88847 \times 10^{-8}$
$a_6 = -0.32501 \times 10^{-12}$
$a_8 = 0.91594 \times 10^{-14}$
$a_{10} = -0.44569 \times 10^{-20}$
8th surface $a_4 = 0.32035 \times 10^{-7}$
$a_6 = 0.16595 \times 10^{-12}$
$a_8 = 0.26513 \times 10^{-16}$
$a_{10} = 0.32600 \times 10^{-20}$
11th surface $a_4 = 0.4460 \times 10^{-11}$
$a_6 = -0.19930 \times 10^{-15}$
$a_8 = 0.21867 \times 10^{-18}$
$a_{10} = -0.13646 \times 10^{-24}$
15th surface $a_4 = -0.21049 \times 10^{-7}$
$a_6 = -0.89312 \times 10^{-13}$
$a_8 = -0.47612 \times 10^{-14}$
$a_{10} = -0.84793 \times 10^{-21}$ -continued 18th surface $a_4 = 0.85152 \times 10^{-7}$
$a_6 = 0.24261 \times 10^{-10}$
$a_8 = 0.13124 \times 10^{-13}$
$a_{10} = -0.52618 \times 10^{-17}$
WDO = 50.000
WD = 39.710
$f = \infty$
ENP = $\infty$
d/D = 0.013
h/H = 0.087
$|f_{def}/f_{ref}|/D = 0.0066$
$|h_{def} - h_{ref}|/H' = 0.0337$ In each example the present invention has been described as using as the light source a spectral light source (ArF excimer laser) having a given spectral half-width and a center wavelength of 193.5 nm, it is to be understood that the present invention is applicable to an KrF excimer laser having a center wavelength of about 248 nm. The KrF excimer laser may be used to achieve some practical projection lens system even without recourse to the present invention. By use of the present invention, however, it is possible to achieve more improved performance and reduce the number of lenses. Thus, the present invention makes a great deal of contribution to size and cost reductions in projection lens systems. As the light source, it is possible not only to use excimer lasers but also to employ the fourth to sixth harmonics of an YAG laser having an oscillation wavelength of 1.06 μm as well as a spectrum of about 254 nm center wavelength that a low-pressure mercury lamp has.

As described above, the present invention makes it possible to provide a high resolution projection lens system which enables chromatic coma to be corrected for a spectral light source having its center wavelength lying at up to 300 nm, even when it is made of a single vitreous material, and can be improved in terms of transmittance by making the total thickness of the vitreous material forming part of the lens system thin. It is here to be noted that this advantage cannot be obtained without the use of both the diffractive optical element and the aspheric refractive optical element for a projection lens system.

What I claim is:

1. A reduction projection lens system for forming a reduced image of an object using light from a light source that emits light having a center wavelength of up to 300 nm, wherein said projection lens system includes:

at least one refractive optical element having an aspheric surface;

at least one diffractive optical element; and a pupil;

wherein said system conforms to the following conditions:

0.02<|d/D|<0.17    (3)

0.01<|h/H|<0.25    (4)

where d is a distance from the pupil of the lens system to the diffractive optical element, D is a conjugate distance, h is height of an off-axis principal ray of maximum image height in the diffractive optical element, and H is an effective radius of the diffractive optical element.

2. The reduction projection lens system as claimed in claim 1, wherein:

said lens system includes, in order from the object side, a first lens unit of negative power, a second unit of positive power and a third lens unit of positive power, said first lens unit includes a negative lens having an aspheric surface, said second lens unit includes a positive lens and a negative lens, and said third lens unit includes a diffractive optical element and a positive lens.

3. The reduction projection lens system as claimed in claim 2, wherein:

said first lens unit consists of a negative single lens, said second lens unit consists of a negative meniscus lens convex on the object side and two positive lenses, and said third lens units consists of a diffractive optical element having positive power and two positive meniscus lenses convex on the object side.

4. The reduction projection lens system as claimed in claim 1, wherein:

said lens system includes in order from the object side, a first lens unit of positive power, a second lens unit of positive power and a third lens unit of positive power, said first lens unit includes a negative lens having an aspheric surface, said second lens unit includes a diffractive optical element and a negative lens, and said third lens unit includes a positive lens.

5. The reduction projection lens system as claimed in claim 4, wherein:

said first lens unit consists of a negative lens and positive lenses between which said negative lens is located, said second lens unit consists of a diffractive optical element and two negative meniscus lenses with opposing concave surfaces between which said optical element is located, and said third lens unit consists of a positive lens and a positive meniscus lens concave on the object side.

6. The reduction projection lens system as claimed in claim 3, wherein:

the positive lens on the image side of said second lens unit has an aspheric surface, and the positive meniscus lens on the image side of said third lens unit has an aspheric surface with said diffractive optical element having an aspheric action.

7. The reduction projection lens system as claimed in claim 5, wherein:

each of the lenses of said first lens unit has an aspheric surface, the negative meniscus lens on the object side of said second lens unit has an aspheric surface with said diffractive optical element having an aspheric action, and the positive meniscus lens on the image side of said third lens unit has an aspheric surface.

8. The reduction projection lens system as claimed in claim 1, wherein said system conforms to the following conditions:

$$0.001 < |f_{def}/f_{ref}|/D < 0.008 \qquad (5)$$

$$0.01 < |h_{def} - h_{ref}|/H' < 0.1 \qquad (6)$$

where $f_{def}$ is focal length of the diffractive optical element, $f_{ref}$ is focal length of the lens provided to correct for chromatic coma, $h_{def}$ is height from the optical axis at which the most off-axis principal ray of maximum image height is incident on the diffractive optical element, $h_{ref}$ is height from the optical axis at which the most off-axial principal ray of maximum image height is incident on the lens provided to correct for chromatic coma, and H' is the maximum value of the effective radii of the lens system.

* * * * *